United States Patent [19]

Woodall

[11] Patent Number: 4,801,984
[45] Date of Patent: Jan. 31, 1989

[54] SEMICONDUCTOR OHMIC CONTACT

[75] Inventor: Jerry M. Woodall, Bedford Hills, N.Y.

[73] Assignee: International Business Machines Corporation, Armonk, N.Y.

[21] Appl. No.: 5,321

[22] Filed: Jan. 15, 1987

Related U.S. Application Data

[63] Continuation of Ser. No. 411,114, Aug. 24, 1982, abandoned, which is a continuation of Ser. No. 158,664, Jun. 12, 1980, abandoned.

[51] Int. Cl.[4] .................. H01L 29/161; H01L 29/20; H01L 23/48
[52] U.S. Cl. ........................................ 357/16; 357/61; 357/65
[58] Field of Search .................. 357/16, 30, 61, 65

[56] References Cited

U.S. PATENT DOCUMENTS 4,144,540  3/1975  Bottka ................................. 357/26
4,173,763  11/1979  Chang et al. ..................... 357/16 X

OTHER PUBLICATIONS

S. M. Sze, *Physics of Semiconductor Devices*, (1981), pp. 304–307.
K. Kajiyama et al., "Schottky barrier height of n-$In_x$-$Ga_{1-x}As$ diodes", *Applied Physics Letters*, vol. 23 (Oct. 1973), pp. 458–459.
C. Y. Chang et al., "Specific contact resistance of metal–semiconductor barriers", *Solid–State Electronics*, vol. 14 (1971), pp. 541–550.

*Primary Examiner*—J. Carroll
*Attorney, Agent, or Firm*—Alvin J. Riddles; Thomas J. Kilgannon

[57] ABSTRACT

An ohmic contact to intermetallic semiconductors with a resistance of much less than $10^{-6}$ ohm $cm^2$ can be provided by introducing between the semiconductor and an external metal contact an atomically compatible barrier-free graded layer of a conductor having at the interface with a metal external contact an energy gap width of the semiconductor less than 0.5 electron volts. An ohmic contact for gallium arsenide can be provided by a graded region of indium gallium arsenide that decreases to indium arsenide at the interface with a metal.

8 Claims, 2 Drawing Sheets

4,801,984

SEMICONDUCTOR OHMIC CONTACT

This application is a continuation of application Ser. No. 06/411,114 filed Aug. 24, 1982, abandoned, which in is a continuation of application Ser. No. 06/158,664 filed June 12, 1980, abandoned.

DESCRIPTION

TECHNICAL FIELD

The technical field of the invention is that of external contacts to intermetallic or multielement semiconductor devices. Simple metal external contacts to intermetallic type semiconductors exhibit barriers to carrier flow that are inherent in the device physics and which introduce resistance that can be a significant inhibitor to device performance.

BACKGROUND ART

The recognition of the presence of a barrier to current flow at the surface of an intermetallic-semiconductor is present in the art. One approach has been the use at the surface of the device of heavy doping using such materials as germanium. This approach is exemplified by U.S. Pat. No. 4,188,710, wherein the heavy doping reduces the barrier. Another approach is illustrated in U.S. Pat. No. 3,984,261 wherein an abrupt layer of indium gallium arsenide is placed on a gallium arsenide semiconductor device. This abrupt structure, however, introduces another barrier which while smaller than the barrier at the surface still inhibits device performance.

DISCLOSURE OF THE INVENTION

A low resistance ohmic contact to an intermetallic semiconductor can be provided by introducing between a metal external contact and the semiconductor an atomically compatible barrier-free semiconductor region with a graded band gap that decreases from the band gap of the intermetallic semiconductor to less than 0.5 electron volts at the interface with the metal external contact. An atomically compatible semiconductor will have an absolute fractional difference in lattice constants at the interface with the intermetallic semiconductor that is either no more than 0.005, or less than the amount necessary to cause misfit dislocation to form. The semiconductor will be atomically compatible with the intermetallic semiconductor if it can be doped to at least a level of $10^{19}/cm^3$ and there is an electron affinity difference between that of the semiconductor and that of the intermetallic semiconductor that is not greater than 0.04 electron volts at the interface with the intermetallic semiconductor.

The combination of features of the structure meeting these criteria, operates to overcome several types of barriers to carrier flow caused by surface states, by differences of electron affinity which operate to introduce resistance which in turn inhibits device performance.

Figure 1:
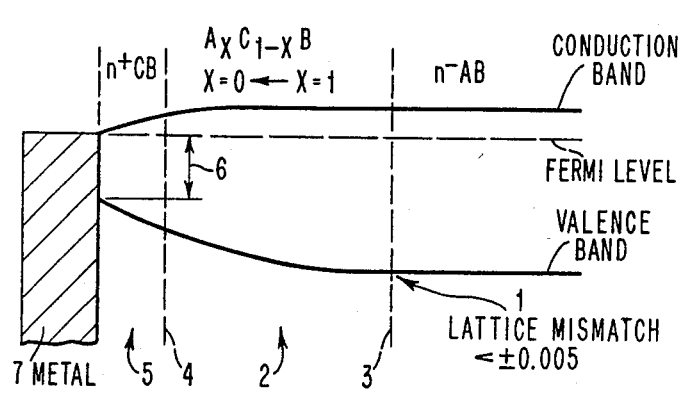
FIG. 1 is an energy level diagram illustrating the conditions present in the low resistance ohmic contact of the invention.

Referring to FIG. 1 the features of the ohmic contact of the invention are illustrated in connection with an energy level diagram. The ohmic contact itself involves a metal external electrode separated from a body of an intermetallic semiconductor by an intermediate semiconductor region that operates to prevent barrier formation. In FIG. 1 the intermetallic semiconductor is designated 1 which may, for example, be a binary semiconductor designated AB, as for instance, the material gallium arsenide. The body 1 is shown as having an n-conductivity type. For illustration purposes the energy diagrams in the description will be drawn with n- as an example conductivity type, as is well known to those skilled in the art. The transition to the opposite conductivity type may readily be made.

An intermediate semiconductor region 2 is provided that, in essence, avoids a barrier at the surface where an external metal electrode is placed yet does not introduce an interface barrier where it joins the body 1.

In accordance with the invention this is accomplished by providing a close lattice match and small electron affinity difference with the body 1, a small energy gap at the surface with the metal and a graded band gap in between. A graded region of a semiconductor is provided labelled 2. Where the body 1 is a binary semiconductor such as gallium arsenide, the semiconductor may be a ternary semiconductor such as GaInAs having two ingredients, A and B, in common with the binary semiconductor and may have the third ingredient C graded with respect to the first ingredient A such that the ingredient C is essentially zero or in other words GaAs at the interface 3 with the body 1 thereby satisfying a barrier forming lattice mismatch requirement and the ingredient A is reduced to essentially zero or in other words, InAs at a line labelled 4.

In other words, the other side of the line 4, in essence, the ternary semiconductor ACB will have been converted to another binary semiconductor CB in a region labelled 5 and this semiconductor is such that the energy gap width 6 at an interface with the metal 7 is less than 0.5 electron volts and may be doped to at least $10^{19}/cm^3$.

It is necessary that the absolute fractional lattice mismatch between the atomically compatible semiconductor and the body 1 semiconductor at the interface 3 not exceed 0.005, or the value which causes misfit dislocation to form. These conditions can be readily satisfied for a binary semiconductor by providing a ternary semiconductor with two elements in common and decreasing the extra element to zero at the interface. As the extra element increases and one of the common elements decreases, the valence band will rise through the bandgap grading such that the energy gap 6 at the interface with the metal 7 will be the bandgap of the CB semiconductor 5 which for indium arsenide will be a gap 6 in the vicinity of 0.35 electron volts.

Figure 2:
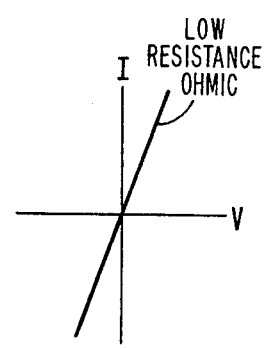
FIG. 2 is a current-voltage graph illustrating the ohmic performance of the contact of the invention.

Referring to FIG. 2 a voltage-current graph of such a contact is shown. Since all barriers caused by surface carrier traps or states, or by carrier traps at the interface with the region 2 and the body 1 are avoided, the current-voltage characteristic will be a low resistance slope straight line labelled low resistance ohmic. The contact of the invention provides resistance values much less than $10^{-6}$ ohm cm$^2$.

BEST MODE FOR CARRYING OUT THE INVENTION

In intermetallic semiconductors, that is, semiconductors wherein the crystal lattice is made up of periodically arranged atoms of more than one element such as the material gallium arsenide (GaAs), the surface is such that a barrier to current flow is present when a metal external electrode is applied. The presence of the barrier introduces resistance which can interfere with device performance in small signal devices such as Field Effect Transistors or in larger signal devices such as Laser applications.

The contact resistance problem has received attention in the art with some improvement but it has been found that techniques which provide what appears to be an ohmic contact for one type of signal operation in reality is introducing a barrier at another point in the device. All barriers are overcome by the structural conditions of the invention.

An ideal ohmic contact may be considered to be one in which the resistance is as shown in Equation 1.

$$\rho_c = \left(\frac{\partial J}{\partial V}\right)^{-1} \text{ ohm cm}^2 \quad \text{Equation 1}$$

where J=current density through contact at V≈0.

In order for the rate of change of current and voltage to remain constant, it will be necessary to avoid all non-linear barriers.

The first such non-linear barrier is of the Schottky type wherein a metal contact is placed on the surface of the semiconductor. Under these conditions, a barrier occurs due to a difference of work functions and electron affinities between the metal and the semiconductor.

Figure 3:
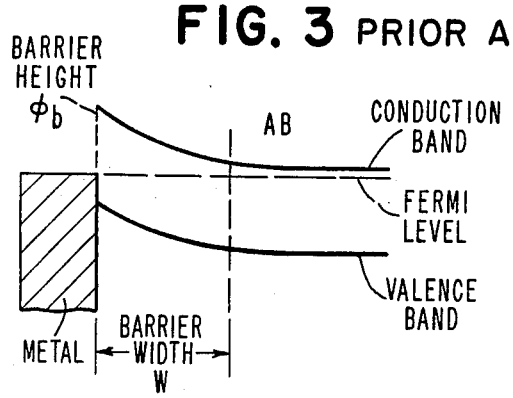
FIG. 3 is an energy level diagram illustrating the barrier to carrier flow present with intermetallic semiconductor metal contacts.

Referring to FIG. 3 an energy level diagram is provided illustrating a metal contact and barrier on an intermetallic semiconductor. The barrier height is labelled $\phi_b$ and may be expressed for the ideal Schottky barrier contact in Equation 2.

$$\phi_b = \phi_m - \chi \quad \text{Equation 2:}$$

where
$\phi_b$=barrier height
$\phi_m$=work function of metal contact -
$\chi$=electron affinity of the semiconductor which in turn is the energy to remove an electron from the bottom of the conduction band to vacuum with no kinetic energy.

Equation 2 will be valid when the density of surface states or carrier traps on the intermetallic semiconductor is small and the metal is inert with respect to the semiconductor. Under these conditions, ohmic contacts will occur when $\phi_m$, the work function of the metal contact is less than or equal to $\chi$ the electron affinity of the semiconductor. In practice, however, this situation is rarely observed, especially for elemental and III-V compound intermetallic semiconductors. For example, in the material gallium arsenide, currently receiving considerable attention in the art, the barrier $\phi_b$ of FIG. 3 is nearly always observed to be 0.7 to 0.8 electron volts regardless of the metal used for the contact and its attendant $\phi_m$. Explanations have been given in the art that the constancy of the barrier $\phi_b$ of FIG. 3 the gallium arsenide has been attributed to a large density of surface states on the gallium arsenide which operates to pin the barrier $\phi_b$. The magnitude of the barrier $\phi_b$ has had serious detrimental effects since it introduces resistance.

Figure 4:
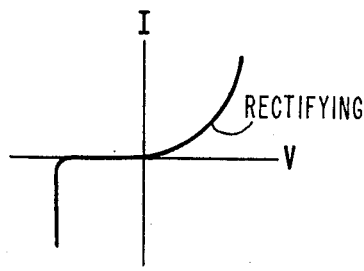
FIG. 4 is a voltage-current graph indicating the rectifying performance of the contact of FIG. 3.

At the present state of the art an evaporated gold contact on gallium arsenide which has been doped to less than or equal to $10^{18}$/cm$^3$ still results in a rectifying contact as shown from the voltage-current graph of FIG. 4.

Figure 5:
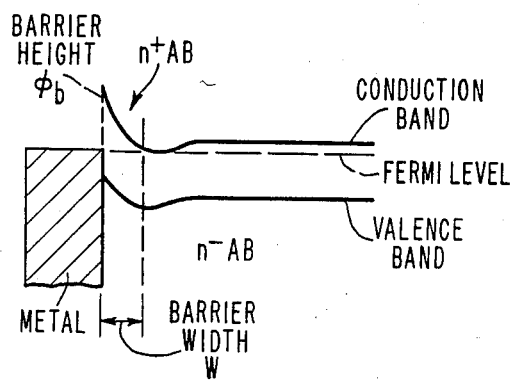
FIG. 5 is an energy level diagram illustrating the effect of high doping at the interface of an intermetallic semiconductor metal contact.

Efforts have taken place in the art that have improved the barrier situation through the use of alloyed contacts but these have some processing limitations. Referring to FIG. 5 an energy level diagram is shown illustrating an alloyed type contact similar to the example set forth in U.S. Pat. No. 4,188,710 wherein an alloyed contact such as gold-germanium has been employed.

Figure 6:
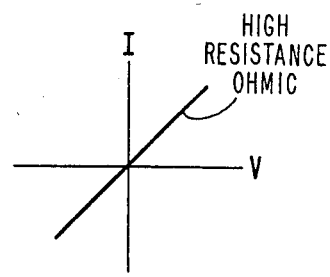
FIG. 6 is a voltage-current graph indicating ohmic but high resistance performance of the contact of FIG. 5.

Referring to FIG. 5 the barrier height $\phi_b$ is present but very heavy doping of the region immediately adjacent the metal contact for a short distance operates to produce a drop in both the conduction and valence band and to sharply narrow the barrier width labelled w. When the barrier width comes into a range for quantum mechanical tunneling, the carriers no longer have to surmount the full barrier $\phi_b$ but rather tunnel through and consequently as illustrated in FIG. 6, the contact performance is ohmic. Even so, for the high doping levels of about $10^{19}$/cm$^2$ achievable for GaAs, this type of contact still gives rise to contact resistance of $\geq 10^{-3}$ 10$^{-6}$ ohm cm$^2$ and the operating characteristic in FIG. 6 is labelled high resistance ohmic.

The processes available in the art to provide the heavily doped, narrow w region conditions for tunneling require close control. The processing, with the attendant heat, introduces process problems that result in difficulty of reproducible results. The depletion width w is a function of doping and is exponentially related to the reciprocal of the doping density. This is a very sensitive parameter. Tunnelling dimensions for w are of the order of a few hundred angstroms but not only are precise times and temperatures required to form the contact but subsequent process steps may interfere with the contact so that not only does the contact require extraordinary control to produce, contact-to-contact parameters are seldom uniform and subsequent heat related processing may change the contact parameters.

A second problem occurs with the heavily doped type of contact of FIG. 5 in that the $\phi_b$ does introduce some contact resistance and where $\phi_b$ is greater than 0.5 electron volts, even though the rate of change of current with voltage would indicate a contact that is ohmic in nature, still some contact resistance will be present which may be significant in some signal situations. This is true even where the doping density is in the range of $10^{18}/cm^3$ or $10^{19}/cm^3$.

It has been found in accordance with the invention that the best contact resistance for this type of contact is in the vicinity of about $10^{-6}$ ohm centimeters square. Thus, even though the heavily doped or alloy contact as illustrated in connection with FIG. 5 is an improvement over the situation of FIG. 3, the fact remains that it is necessary to lower $\phi_b$ to the less than 0.5 electron volts as set forth in accordance with the invention and especially for contacts to lightly doped or n- material where the doping level is less than $10^{17}/cm^3$ it is necessary to keep $\phi_b$ less than 0.5 electron volts in order to provide full device performance flexibility.

Another approach to the contact resistance problem in the art has been the introduction of a semiconductor layer between the intermetallic semiconductor and the metal contact that operates to somewhat reduce the barrier $\phi_b$. An illustration of this type of approach is shown in U.S. Pat. No. 3,984,261 wherein a region of indium gallium arsenide (InGaAs) is applied on gallium arsenide (GaAs). In a structure of this type, however, an improvement at the barrier on the surface is offset as is illustrated in FIGS. 7-10, by the fact that a different barrier is introduced at the interface with the intermetallic semiconductor.

Figure 7:
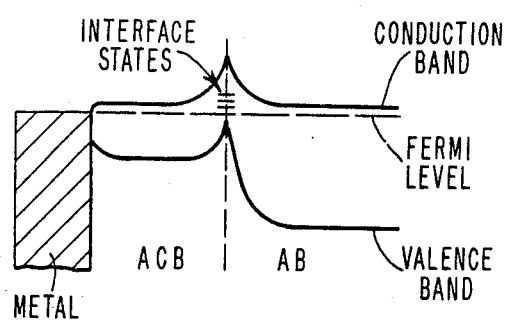
FIG. 7 is an energy level diagram illustrating a barrier present within an intermetallic device when the lattice constants of a semiconductor positioned between a metal contact and the intermetallic semiconductor are mismatched.
Figure 8:
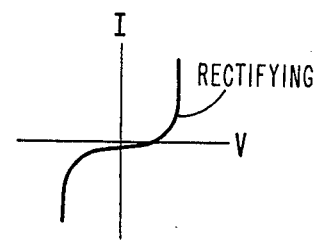
FIG. 8 is a voltage-current graph indicating rectifying performance of the contact of FIG. 7.

Referring to FIG. 7 an energy level diagram illustrates the type of contact wherein a lower bandgap semiconductor is inserted between the intermetallic semiconductor and the metal external contact. One barrier situation is caused by carrier traps or interface states at the interface of the two semiconductors. In accordance with the invention this type of barrier is avoided by specifying a lattice match within an absolute fraction of 0.005. FIG. 7 illustrates a situation in which between the lower bandgap semiconductor and the intermetallic semiconductor the lower bandgap semiconductor lattice spacing is larger than that of the intermetallic semiconductor. In this instance interface states are shown which operate as carrier traps and introduce a barrier such that the contact performs as illustrated in the operating characteristic of FIG. 8 as a rectifier.

Figure 9:
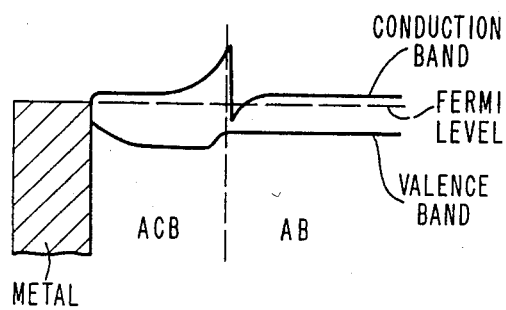
FIG. 9 is an energy level diagram illustrating a barrier present within an intermetallic device when lattice constants and electron affinities of a semiconductor positioned between a metal contact and the intermetallic semiconductor are matched and different respectively.

Referring next to FIG. 9 a condition for a second barrier situation is illustrated wherein the electron affinity of the lower bandgap semiconductor is smaller than that of the intermetallic semiconductor. In this type of situation there is no appreciable lattice mismatch and hence there are no appreciable interface states but a barrier to electron flow still occurs and the device operates as illustrated in FIG. 10 as a rectifier.

In both situations, the lower bandgap semiconductor reduces the barrier at the interface with the metal but another barrier is encountered at the interface of the semiconductors.

Figure 10:
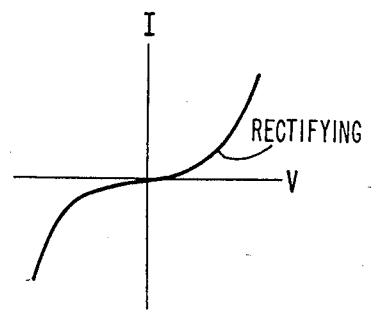
FIG. 10 is a voltage-current graph of the contact of FIG. 9 indicating rectifying performance.

In accordance with the invention it has been found that the barrier situations of FIGS. 9 and 10 can be avoided for practical purposes by requiring that the fractional lattice mismatch not exceed 0.005 and that the conditions of the following Equations 4 and 5 be met.

$$\frac{\alpha_{ACB} - \alpha_{AB}}{\alpha_{AB}} \leq 0.005 \qquad \text{Equation 4}$$

where
- $\alpha_{ACB}$ = lattice constant of the lower bandgap or ternary semiconductor; and
- $\alpha_{AB}$ = lattice constant of the intermetallic or binary semiconductor -

In accordance with the invention an electron affinity match is provided between the lower bandgap semiconductor and the intermetallic semiconductor within 0.04 electron volts as expressed in Equation 5.

$$|X_{AB} - X_{AC}| \leq 0.04 \, eV \qquad \text{Equation 5}$$

where $\chi$ is the electron affinity of the semiconductor which in turn is the energy to remove an electron from the bottom of the conduction band to vacuum with no kinetic energy.

In accordance with the invention by using a graded bandgap semiconductor, as illustrated in FIG. 1, lattice mismatches and other dislocations can be minimized.

Referring again to the energy diagram of FIG. 1. In a preferred embodiment an n-type layer 2 of the semiconductor ACB will be epitaxially grown by one of the techniques in the art of chemical vapor deposition (CVD) or molecular beam epitaxy (MBE) on an n-type body 1 AB semiconductor using for the AB semiconductor gallium arsenide and the ACB semiconductor $Ga_xIn_{1-x}As$ in which x varies to provide a graded composition from pure gallium arsenide at the interface 3 and hence a perfect lattice and electron affinity match to pure indium arsenide at the interface 4 over a distance of approximately 2,000Å. In such a structure in the region 5 at the interface with the metal, the Fermi level is pinned in the conduction band at the n+ indium arsenide interface at an energy of 0.5 eV above the indium arsenide valence band. The energy gap for indium arsenide is approximately 0.35 electron volts. A gold metal contact 7 is evaporated or electroplated with no heating. The resulting structure in accordance with the invention produces an ohmic contact to n-type indium arsenide where the contact resistance is less than $5 \times 10^{-7}$ ohm cm$^2$.

What has been described is a technique of fabricating ohmic contacts to intermetallic semiconductors wherein all the barriers to current flow are avoided.

Having described the invention, what is claimed as new and what is desired to secure by Letters Patent is:

1. An ohmic contact having a resistivity of the order of $10^{-6}$ ohm cm$^2$ joining a metal member to an intermetallic semiconductor crystal body of gallium arsenide comprising:
    an atomically compatible semiconductor intermediate region of gallium induim arsenide between said metal and said intermetallic semiconductor material crystal body,
    said region being heavily doped to a doping level of the order of $10^{19}$ atoms/cc,
    said region having a first interface thereof with said semiconductor crystal body having at least one of
    a fractional lattice match with respect to said crystal body within ±0.005,
    an electron affinity difference with respect to the semiconductor material of said crystal body not greater than 0.04 electron volts, and said region having an energy gap width at a second interface at said metal that is less than 0.5 electron volts and being graded in concentration from pure gallium arsenide at said first interface to pure indium arsenide at said second interface.

2. An ohmic contact having a resistivity on the order of $10^{-6}$ ohm cm² joining a metal member to an intermetallic semiconductor crystal body comprising:
   a graded bandgap heavily doped intermediate semiconductor region, having a first interface with said crystal body and a second interface with said metal member and having at said first interface with respect to the semiconductor material of said body at least one of
   a lattice match within ±0.005 and
   an electron affinity difference not greater than 0.04 electron volts, and
   having an energy gap at said second interface at said metal member that is less than 0.5 electron volts.

3. The ohmic contact of claim 2 wherein the doping in said heavily doped region is of the order of $10^{19}$ atoms/cc.

4. The ohmic contact of claim 3 wherein the material of said intermetallic semiconductor is gallium arsenide, and the material of said intermediate semiconductor region is gallium indium arsenide.

5. The ohmic contact of claim 4 wherein
   said gallium indium arsenide is graded such as to be pure gallium arsenide at said first interface and pure indium arsenide at said second interface.

6. An ohmic contact having a resistivity on the order of $10^{-6}$ ohm cm² between a metal member and an intermetallic semiconductor device crystal body wherein
   a graded bandgap region is provided between said metal member and said crystal body that is doped to the level of $10^{19}$ atoms/cc, that is atomically compatible at a first interface with said crystal of said body and
   that has a bandgap width at a second interface at said metal member that is less than 0.5 electron volts.

7. The ohmic contact of claim 6 wherein the material of said graded bandgap region is a ternary semiconductor and
   the semiconductor material of said intermetallic semiconductor crystal body is a binary semiconductor with two elements in common with said ternary semiconductor.

8. The ohmic contact of claim 7 wherein said ternary semiconductor is GaInAs and said binary semiconductor is GaAs.

* * * * *